United States Patent [19]

Meunier et al.

[11] Patent Number: 5,465,190
[45] Date of Patent: Nov. 7, 1995

[54] CIRCUIT AND METHOD FOR PROTECTING POWER COMPONENTS AGAINST FORWARD OVERVOLTAGES

[75] Inventors: Philippe Meunier, Aix-en-Provence; Antoine Pavlin, Puyricard, both of France

[73] Assignee: SGS-Thomson Microelectronics S.A., Saint-Genis, France

[21] Appl. No.: 88,302

[22] Filed: Jul. 7, 1993

[30] Foreign Application Priority Data

Jul. 16, 1992 [FR] France ................................ 92 09119

[51] Int. Cl.[6] ........................ H02H 9/04; G05F 3/26
[52] U.S. Cl. .................................. 361/91; 361/56
[58] Field of Search ........................... 361/91, 56, 54

[56] References Cited

U.S. PATENT DOCUMENTS

| | | | |
|---|---|---|---|
| 4,589,049 | 5/1986 | Krumrein | 361/56 |
| 4,860,152 | 8/1989 | Osborn | 361/91 |
| 4,890,185 | 12/1989 | Karl et al. | 361/91 |

Primary Examiner—A. D. Pellinen
Assistant Examiner—Michael Sherry
Attorney, Agent, or Firm—Greenfield & Sacks

[57] ABSTRACT

A circuit protects a power transistor of the vertical MOS or IGTB-type during the off state against forward overvoltages. The protection circuit includes a first circuit for limiting the voltage across the transistor to a predetermined voltage, lower than the forward breakdown voltage of the power transistor, a circuit for detecting the quantity of energy dissipated in the transistor when the first circuit is enabled, and a second circuit for turning the transistor on at low impedance. The second circuit is enabled when the detection circuit has detected that the dissipated energy has exceeded a predetermined energy threshold.

20 Claims, 3 Drawing Sheets

CIRCUIT AND METHOD FOR PROTECTING POWER COMPONENTS AGAINST FORWARD OVERVOLTAGES

BACKGROUND OF THE INVENTION

1. Field of the Invention

The present invention relates to circuits for protecting power components such as vertical MOS (VDMOS) or insulated-gate bipolar transistors (IGBT) against forward overvoltages.

2. Discussion of the Related Art

In the following description, power MOS transistors will always be referred to. However, it should be understood that the whole description also applies to insulated-gate bipolar transistors (IGBT) whose structure is substantially identical, except for the fact that they include, on a back face thereof, an additional layer having a conductivity type opposite to that of the layer forming the rear surface of a power MOS transistor.

FIG. 1 is a schematic cross-sectional view of a conventional embodiment of a vertical MOS transistor. The MOS transistor is formed in an N-type substrate 1, whose back surface includes an overdoped $N^+$-type layer 2 coated with a drain metallization 3. In the front surface thereof are formed P-type wells 4 including a more highly doped central region 5 and a lower doped peripheral region 6. The internal periphery of each well includes a highly doped N-type diffused region 7. A conductive gate 8 is formed above an insulating layer 9, and overlaps two adjacent wells or cells. Gate 8 is protected by an insulating layer 10 and the whole upper surface is coated with a source metallization 11 that contacts the $N^+$-type regions and the central portion of each cell.

The transistor of FIG. 1 is turned on so that it is conductive between its drain and its source, the drain being positive with respect to the source when a voltage is applied to the gate. Then, a current flows from the drain, through substrate 1 and a channel region formed at the upper portion 12 of the P-type wells beneath the gate region, to region 7 and the source metallization.

The difference between the structure of an IGBT and the VDMOS transistor shown in FIG. 1 includes that region 2 of the IGBT is of the $P^+$-type instead of the $N^+$-type. The IGBT's main electrodes are then generally referred to as emitter and collector, and its control terminal is still referred to as a gate.

A component such as the one of FIG. 1 should be turned on only when its drain is positive with respect to its source and when a signal is provided to its gate. However, when a high voltage is applied to the drain, the junction between substrate 1 and well 4, may then be set into avalanche mode. Such a breakdown is not desirable because it may cause heating of the area where the avalanche mode is generated due to excessive current flow; such heating can have a destructive effect.

Therefore, one tries to avoid such a spontaneous avalanche (without gate control). In the prior art, various methods have already been provided in order to detect the occurrence, across a component, of an overvoltage having a value close to its avalanche voltage, and to set the component to conduction mode before the avalanche value is reached.

Conventionally, two types of protection circuits are available. The first type is a clamp circuit, the second type is a crowbar circuit.

FIGS. 2A and 2B schematically show the connection of a power transistor 20 whose source is connected to ground and drain is connected to a first terminal of a load 21 having its second terminal connected to a positive supply terminal VCC. The conduction of transistor 20 is controlled by a gate drive circuit 22. Circuit 22 is generally controlled from an external access terminal 23.

FIG. 2A more particularly shows a clamp-type protection circuit. Between drain and gate of the MOS transistor 20 are serially connected an avalanche diode (usually referred to as a zener diode) Z1 and a reverse biased diode D1. Zener diode Z1 has an avalanche volt-age that is selected slightly lower (usually a few tens of volts) than the avalanche voltage of MOS transistor 20. Diode D1 is operable to prevent, under normal operation conditions, the gate current from flowing toward the transistor drain.

In this circuit, when an overvoltage having an amplitude higher than the avalanche voltage of zener diode Z1, plus the voltage drop VF of diode D1 and the gate-source threshold voltage VGS of transistor 20, occurs, the MOS transistor is set to conduction mode. For the sake of simplification, it is assumed that the leakage current in the gate drive circuit 22 is negligible. However, during the time transistor 20 is set to conduction state, its drain stays at voltage VZ1+VF+VGS, that is, the voltage drop across the MOS transistor is significant and the MOS transistor is set to a partial conduction state only. The energy will then be mainly dissipated in the transistor that has a high voltage drop across its terminals and a non-negligible current. If this energy is high, it is capable of destroying the MOS transistor through heating. Thus, the above-mentioned clamp-type protection mode applies only when it is desired to achieve protection against overvoltages having a low energy. Such low energy overvoltages occur, for example, after the initial switching-on of a slightly inductive load. The advantage of this protection mode is that the conduction of the MOS transistor is interrupted as soon as the overvoltage disappears.

FIG. 2B schematically shows a crowbar-type protection circuit. In this case, the zener diode Z1 connected to the drain of transistor 20 is also connected to an overvoltage detection circuit 24. As soon as an overvoltage occurs, circuit 24 provides a signal at terminal 23 of the gate drive circuit 22 that causes the transistor 20 to go into the conduction state. Once transistor 20 goes into conduction due to gate drive circuit 22, the voltage across its terminals drops to a low value (RON); therefore, it is no longer possible to determine through the detection circuit 24 whether an overvoltage is still present or not. The advantage of this type of connection is that, since the voltage across transistor 20 drops to a low value, little energy is dissipated in transistor 20. The drawback lies in the fact that such a protection is triggered even for overvoltages having a very low energy, for which such a protection is superfluous.

In sum, in the prior art, two types of protection circuits are available. One protection circuit is suitable for protections against low energy overvoltages but is capable of destroying the component if the overvoltage energy is too high. The second protection circuit is suitable for protections against high energy overvoltages but unduly impairs the operation of the switching element when low energy voltages only are to be eliminated.

SUMMARY OF THE INVENTION

An object of the invention is to provide a VDMOS transistor (or IGBT) protection circuit adapted both to low energy overvoltages and high energy overvoltages.

Another object of the invention is to provide such a protection circuit adapted to "Smart Power" MOS technologies in which a power transistor, and logic components for controlling the power transistor, are integrated on a single semiconductor chip.

To achieve these objects, the invention provides a circuit for protecting a vertical MOS transistor power transistor or an IGBT, in the off state, against forward overvoltages, including: first means for setting the conduction state so as to limit the voltage across the power transistor to a predetermined voltage, that is lower than the forward breakdown voltage of the power transistor; detection means for detecting the quantity of energy dissipated in the power transistor while the first means are active; and second means for setting the power transistor conductive at a low impedance, such means being enabled when the detection means detect that the dissipated energy has exceeded a predetermined energy threshold value.

According to an embodiment of the invention, the detection means include: means for charging a capacitor to a predetermined voltage while the power transistor is in the off state; means for interrupting charging of the capacitor, and means for discharging the capacitor through a discharge current proportional to the current in the power transistor, as soon as the power transistor starts being conductive under the effect of the first means; and means for detecting the voltage across the capacitor.

According to an embodiment of the invention, the first means include the serial connection of a zener diode and a reverse biased connected diode, this connection being arranged between the drain and gate of the power transistor.

According to an embodiment of the invention, the second means includes means for enabling a gate drive circuit.

According to an embodiment of the invention, the charging means includes a current source controlled by an inverter whose input terminal is connected both to ground through a high value resistor and to the junction between the zener diode and the diode.

According to an embodiment of the invention, the capacitor is connected in parallel with a zener diode operable for setting the maximum charge voltage.

According to an embodiment of the invention, the voltage across the capacitor is detected by an inverter whose second terminal is connected to an enabling terminal of the gate drive circuit.

According to an embodiment of the invention, the discharge current is obtained from a current mirror duplicating, if required with a dividing ratio, the current in the detection transistor formed by a predetermined number of cells, identical to the cells forming the power transistor.

According to an embodiment of the invention, the discharge current source of the capacitor is formed by a transistor disposed in series with a resistor, the junction of the transistor and resistor being connected to the inverting input of an operational amplifier whose non-inverting input receives a current from the detection transistor and is connected to ground through a biasing resistor.

Thus, with the circuit according to the invention, when a low energy overvoltage occurs, it is limited to a predetermined clamping value, and the transistor is immediately set again to the off state at the end of the overvoltage. If a high energy overvoltage occurs, the transistor first passes to the clamping state, then, as soon as the occurrence of an energy higher than a predetermined threshold is detected, the component is set to its fully conductive state with a low voltage drop between its main terminals.

The foregoing and other objects, features, aspects and advantages of the invention will become apparent from the following detailed description of the present invention when taken in conjunction with the accompanying drawings.

DETAILED DESCRIPTION

Figure 3:
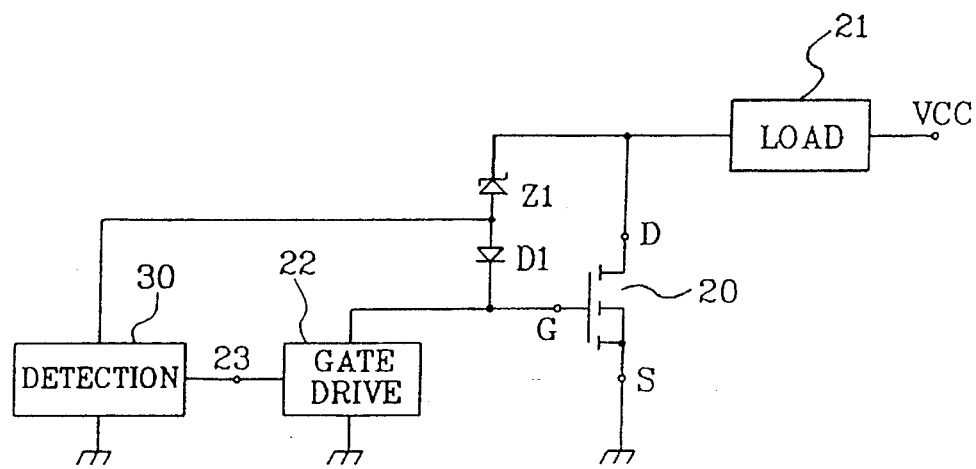
FIG. 3 is a partial block, partial schematic diagram of a circuit according to the invention.

FIG. 3 schematically shows a power MOS transistor 20 whose drain D is connected to a first terminal of a load 21 having its other terminal connected to a power supply voltage VCC. The source S of transistor 20 is connected to ground. The drain D of transistor 20 is further connected to its own gate G through the serial connection of a zener diode Z1 and a diode D1. Additionally, the gate G of transistor 20 is connected to a conventional gate drive circuit 22 having a control terminal 23.

Figure 2A:
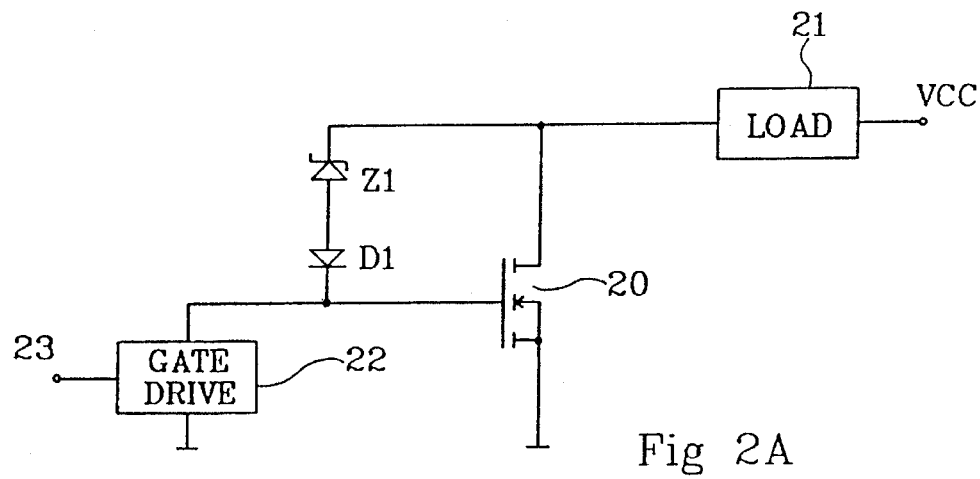

The portion of the circuit described above is identical to the prior art circuit of FIG. 2A. It operates as a clamping circuit, that is, as soon as an overvoltage appears at the terminal of drain D, the voltage of the terminal is clamped at a voltage VZ1+VF+VGS. As described above, the drawback of such clamping protection mode is that it causes excessive heating of transistor 20 when the overvoltage energy is too high.

To avoid this drawback, the invention provides a detection circuit 30 which, from the time an overvoltage appears, that is, the time when the zener diode Z1 has become conductive, detects the energy dissipated through transistor 20 and provides a control signal to terminal 23 of the gate drive circuit 22 as soon as an energy threshold is reached.

Figure 2B:
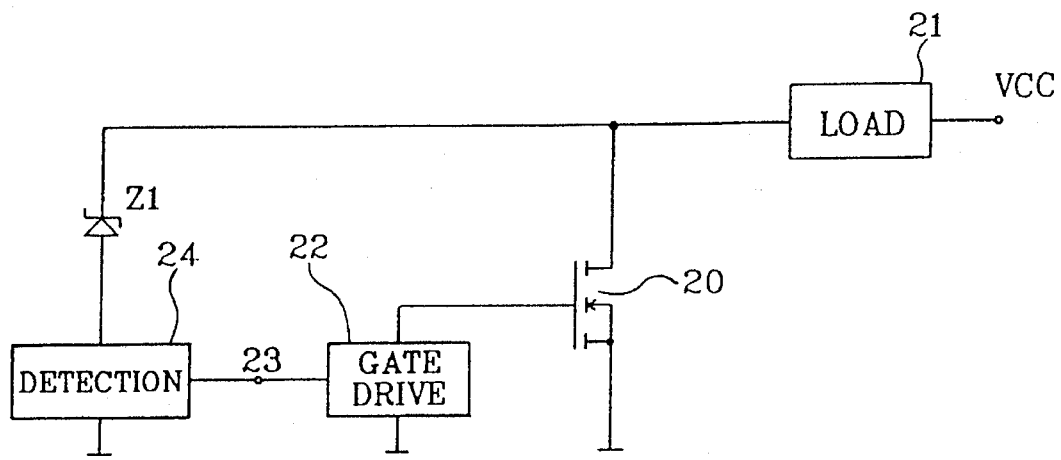

The detection circuit 30 according to the invention, which is an energy detection circuit, should not be mistaken for the detection circuit 24, used in the prior art circuit shown in FIG. 2B, which is an overvoltage detection circuit that is enabled as soon as an overvoltage occurs.

FIG. 4 shows again the main elements of the circuit of FIG. 3, where the energy detection circuit 30 is represented in more detail. This circuit is connected to the junction 31 of diodes Z1 and D1. Terminal 31 is connected to ground through a high value resistor R1 and to the input of a charge control circuit 32, illustrated in FIG. 4 as a simple inverter. The output of inverter 32 is connected to the control terminal of a charge current source ICHG. The charge current source ICHG is operable to charge a capacitor C1, disposed in parallel with a zener diode Z2 and a discharge current source IDIS. The discharge current source duplicates, through a dividing current mirror M, a current IS proportional to the current flowing in the main transistor. The voltage across capacitor C1 is detected by a comparator circuit 33, illustrated as a simple inverter whose output feeds the turn-on terminal 23 of the gate drive circuit 22.

The energy detection circuit 30 operates as follows. While transistor 20 is off and in the absence of overvoltage, terminal 31, corresponding to the input of inverter 32, is grounded through resistor R1. The current source ICHG is then enabled and capacitor C1 is charged until its voltage reaches the avalanche voltage 22 of zener diode Z2 which is, for example, 10 volts. Then, the input of inverter 33 is at a high level, its output is at a low level and the gate drive circuit 22 is no longer enabled, that is, transistor 20 stays in the off state, provided that the gate drive circuit 22 is not controlled otherwise.

When the voltage on drain D of transistor 20 becomes higher than the breakdown voltage of zener diode Z1 (plus the voltage drop VF of diode D1 and the gate-source voltage drop VGS of transistor 20), the zener diode Z1 is turned conductive and terminal 31 is set to a high level. Inverter 32 then interrupts the operation of the charge circuit ICHG, and capacitor C1 is discharged by the current source IDIS. When the voltage across capacitor C1 reaches the threshold voltage VREF of inverter 33, inverter 33 switches and the gate drive circuit 22 is switched on to turn transistor 20 fully conductive whereas zener diode Z1 is set again to the off state. Capacitor C1 is then recharged and inverter 33 provides again a low level signal, but the gate drive is designed so that the transition from a high level to a low level of the input 23 of the gate drive circuit 22 does not interrupt the operation of the gate drive circuit.

Figure 5:
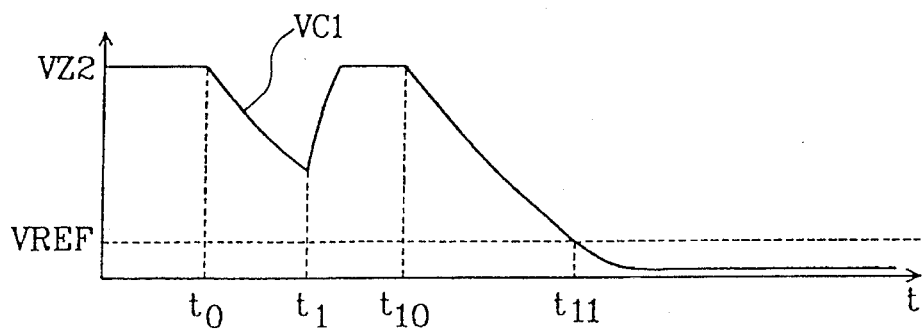
FIG. 5 is a voltage timing diagram, useful for explaining the operation of the circuit of FIG. 4.

FIG. 5 illustrates the variation of voltage VC1 across capacitor C1. First, it is assumed that at a time t0, transistor 20 is off. Capacitor C1 is then charged and the voltage across its terminals is equal to VZ2. When an overvoltage occurs, capacitor C1 is discharged under the effect of the current source IDIS. If, at a time t1, the overvoltage is interrupted, capacitor C1 is recharged and no signal has been provided to terminal 23. Therefore, transistor 20 is immediately reset to its off state. Then, it is assumed that at a time t10, a new overvoltage occurs. If this overvoltage is long-lasting and has a high energy, capacitor C1 is entirely discharged, and, when the voltage across its terminals reaches the reference voltage VREF, signal 23 is provided and transistor 20 is turned on.

It will now be demonstrated that reaching the discharging threshold VREF of capacitor C1 corresponds to the dissipation of a determined amount of energy in transistor 20. Indeed, when transistor 20 is conductive, VD being its drain voltage and ID its drain current, the energy dissipated in transistor 20 between times t10 and t11 is equal to:

$$E = \int_{t10}^{t11} VD \cdot ID \cdot dt = (VZ1 + VF + VGS) \int_{t10}^{t11} ID \cdot dt \quad (1)$$

(the equation corresponds to the case when VD is set to VZ1+VF+VGS, that is, in a clamping situation).

In fact, as indicated above, the discharge current IDIS is proportional to current ID, that is, ID K.IDIS. Hence, $$E = K \cdot (VZ1 + VF + VGS) \int_{t10}^{t11} IDIS \cdot dt \quad (2)$$

Referring to FIG. 5, it can be seen that:

$$VZ2 - VREF = 1/C1 \times \int_{t10}^{t11} IDIS \cdot dt. \quad (3)$$

By combining equations (2) and (3), one obtains:

$$E = K.C1.(VZ1+VF+VGS).(VZ2-VREF). \quad (4)$$

This equation shows that the gate drive circuit 22 is activated when the energy E dissipated in the MOS transistor 20 exceeds a predetermined threshold value that depends on the parameters of the circuit components. These parameters are selected so that the threshold energy E is the highest energy that the power circuit can dissipate before destruction. The circuit according to the invention thus achieves the desired objects.

Figure 1:
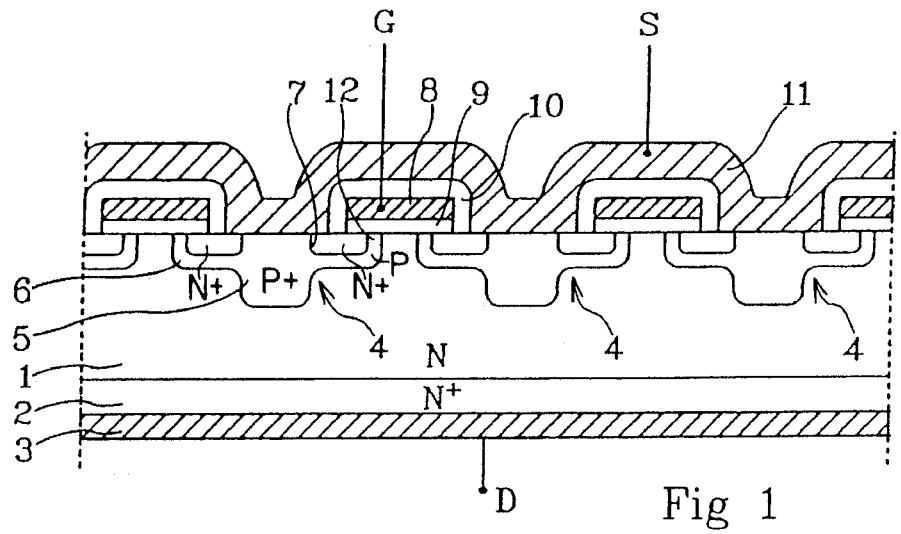
FIGS. 1, 2A and 2B, above described, are, respectively, a cross-sectional view of a conventional vertical power MOS transistor and partial block, partial schematic diagrams of conventional protection circuits.

Additionally, as already indicated, the invention is particularly adapted to an application in the field of Smart Power Chips in which it is desired to fabricate on a same semiconductor chip power components, such as transistor 20 formed by many cells identical to the cells of FIG. 1, and logic components fabricated in one or several P-type wells formed in the substrate 1 of FIG. 1.

Figure 4:
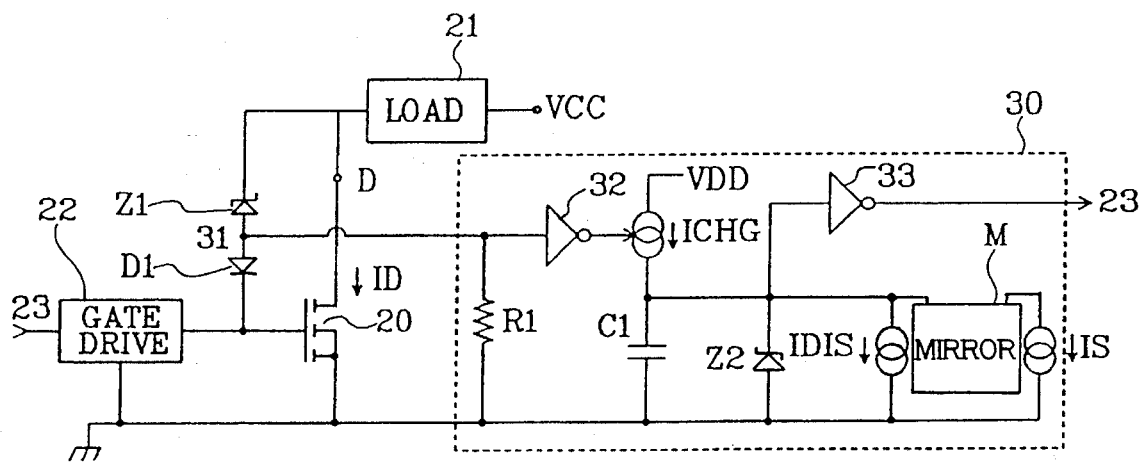
FIG. 4 shows, in more detail, a circuit according to the invention.
Figure 6:
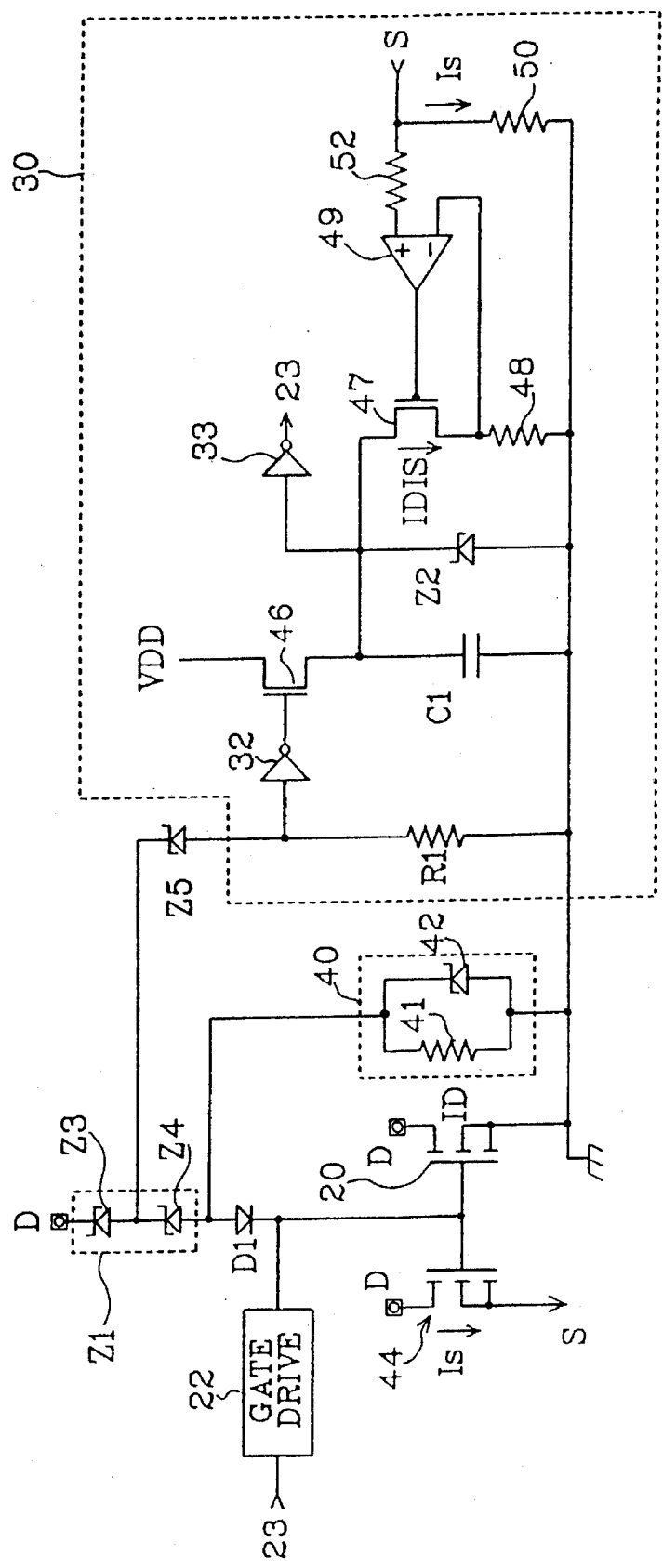
FIG. 6 is a partial block, partial schematic diagram of a circuit according to the invention.

FIG. 6 shows, by way of example, an embodiment of the invention adapted to this technology. In the circuit of FIG. 6, same elements as in FIG. 4 are designated with same reference numerals. More particularly, the circuit of FIG. 6 includes the power transistor 20, zener diode Z1, diode D1, the gate drive circuit 22 and its control input 23, and the circuit 30 operable for detecting the dissipated energy. Circuit 30 includes resistor R1, inverter 32, capacitor C1, zener diode Z2, and inverter 33 and its output 23.

In the circuit of FIG. 6, zener diode Z1 is divided into two diodes, Z3 and Z4, having, for example, a 440-volt and a 10-volt avalanche voltage, respectively, that is, a global 450-volt voltage. A zener diode Z5, substantially identical to zener diode Z4, is interposed between the junction of diodes Z3 and Z4 and the input of inverter 32. Zener diodes Z4 and Z5 are operable to prevent the leakage current from flowing between the energy detection circuit 30 and the gate drive circuit 22.

A protection circuit 40, including in parallel a resistor 41 and a zener diode 42, is provided between the junction of zener diode Z4 and diode D1, and ground. Resistor 41 can, for example, be fabricated by using a depleted MOS transistor easily realizable in this technology. The function of resistor 41 is to prevent the leakage current of zener diode Z1 (Z3–Z4), from biasing the MOS transistor 20. The function of the zener diode 42 is to protect the depleted MOS transistor that forms resistor 41 in order to limit its drain voltage to approximately 10 volts.

In parallel with the power transistor 20, that is, with the same drain connection and the same gate connection, is disposed a detection transistor 44 in which flows a current IS proportional to the current flowing in the MOS transistor 20. In practice, the detection transistor 44 is formed by cells identical to the cells of transistor 20. For example, if transistor 20 includes 10,000 cells, transistor 44 can include 10 cells and will therefore be flown through by a current one thousand times lower than transistor 20.

The charge current source ICHG includes a MOS transistor 46 whose gate is connected to the output of inverter 32. Resistor R1 can, like resistor 41, be fabricated with a depleted MOS transistor.

More particularly, FIG. 6 shows in more detail the energy detection circuit 30 and the construction of its current source IDIS that is proportional to current IS and therefore to the current in transistor 20.

The discharge current IDIS is provided by a transistor 47 in series with a resistor 48 whose second terminal is connected to ground. The junction of transistor 47 with resistor 48 is connected to the input (−) of an operational amplifier 49. The second input (+) of the operational amplifier 49 is connected to source S of the detection transistor 44. This source S is also connected to ground through a resistor 50.

Thus, in the absence of current IS, the non-inverting input (+) of the operational amplifier 49 is connected to ground since no current is provided to resistor 50; the operational amplifier 49 biases transistor 47 so that its inverting input (−) is also connected to ground, that is, no current flows through resistor 48, and current IDIS is equal to zero. However, when a current IS flows through resistor 50, a current proportional to the ratio between the values of resistors 48 and 50 flows through resistor 48. Then, a current IDIS, proportional to current IS, and therefore to the drain current ID in transistor 20, is obtained. As indicated above, the ratio between these currents depends on the ratio between the number of cells forming transistors 20 and 44 and on the ratio between resistors 50 and 48.

It is advantageous to use a very low current IDIS in order to have a low value capacitor C7, of approximately a few picofarads, which is therefore easily integratable. Thus, it is also possible to select a ratio between the IDIS current and the drain current ID of transistor 20 equal to approximately $10^7$, in order to trigger the crowbar-type protection for overloads having an energy of approximately 1 joule and a voltage excursion across capacitor C1 of a few volts. This ratio is obtained by selecting a ratio of 7,000 between currents ID and IS, and a ratio of 70,000 between resistors 48 and 50.

FIG. 6 also shows a serial resistor 52 at input (+) of the operational amplifier 49 so that the two inputs of the operational amplifier 49 have resistive paths to ground of equal value, in order to reduce the voltage offsets that could modify the operation of the operational amplifier 49.

Although a detailed embodiment of the invention, and more particularly of a circuit for detecting the energy dissipated in a power transistor, has been described, it should be noted that the invention generally applies to any embodiment of a circuit according to the invention, even when a distinct circuit for detecting the energy dissipation is used.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A protection circuit for protecting a power transistor during an off state against overvoltages comprising:

first turn-on means, coupled to the power transistor, in response to an overvoltage, for partially turning on the power transistor and maintaining voltage across the power transistor at a predetermined voltage level lower than a forward breakdown voltage of the power transistor;

detection means coupled to the first turn-on means and the power transistor, for detecting a quantity of energy dissipated in the power transistor and for comparing the quantity with a predetermined energy threshold; and second turn-on means, coupled to the detection means and the power transistor, for substantially fully turning on the power transistor when the detection means detects that the quantity has exceeded the predetermined energy threshold.

2. A protection circuit as claimed in claim 1 wherein the detection means includes:

a capacitor coupled to the first turn-on means and power transistor;

means, coupled to the power transistor and the capacitor for charging the capacitor substantially to a predetermined voltage while the power transistor is in the off state; and means, coupled to the capacitor and the power transistor, for enabling discharging of the capacitor by a discharge current substantially proportional to a current in the power transistor when the power transistor is partially turned on by the first turn-on means.

3. A protection circuit as claimed in claim 2 wherein the detection means further includes means, coupled to the capacitor, for determining the voltage across the capacitor.

4. A protection circuit as claimed in claim 3 wherein the power transistor includes a drain terminal and a gate terminal and the first turn-on means includes a serial connection of a first zener diode and a reverse biased diode between the drain and gate terminals of the power transistor.

5. A protection circuit as claimed in claim 4 wherein the second turn-on means includes means, coupled to the gate terminal, for driving the gate terminal with a current.

6. A protection circuit as claimed in claim 4 wherein the means for charging includes a current source, a first inverter and a resistor, the first inverter being coupled to the current source and including an input terminal coupled to both ground, through the resistor, and to the first zener diode and the reversed biased diode.

7. A protection circuit as claimed in claim 4 wherein the capacitor is connected in parallel with a second zener diode.

8. A protection circuit as claimed in claim 7 wherein the means for detecting further includes a second inverter coupled to the capacitor and the power transistor.

9. A protection circuit as claimed in claim 2 further including a discharge current source including a current mirror circuit, coupled to the power transistor, producing the discharge current.

10. A protection circuit as claimed in claim 9 wherein the discharge current source includes a discharge current transistor having a number of cells substantially equal to a number of cells in the power transistor.

11. A protection circuit as claimed in claim 10 wherein the discharge current source further includes a current limiting resistor, a biasing resistor, and an operational amplifier having an inverting input and a noninverting input, wherein the discharge current transistor is connected in series with the current limiting resistor, wherein a junction between the current limiting resistor and the discharge current transistor is connected to the inverting input of the operational amplifier, and wherein the noninverting input of the operational amplifier is connected to ground through the biasing resistor.

12. A protection circuit for protecting a power transistor against overvoltages comprising:

a clamping circuit, coupled to the power transistor, in response to an overvoltage, partially turning on the power transistor and maintaining voltage across the power transistor at a predetermined voltage level lower than a forward breakdown voltage of the power transistor;

a detection circuit, coupled to the clamping circuit and the power transistor, detecting a quantity of energy dissipated in the power transistor and comparing the quantity of energy dissipated with a predetermined energy threshold; and a gate drive circuit, coupled to the detection circuit and the power transistor, substantially fully turning on the power transistor when the detection circuit detects that the quantity of energy dissipated has exceeded the predetermined energy threshold.

13. A protection circuit as claimed in claim 12 wherein the detection circuit includes:

a capacitor coupled to the clamping circuit and the power transistor;

a first current source, coupled to the power transistor and the capacitor, charging the capacitor substantially to a predetermined voltage while the power transistor is in an off state; and a first inverter, coupled to the capacitor and the power transistor, enabling discharging of the capacitor by a discharge current substantially proportional to a current in the power transistor when the power transistor is partially turned on by the gate drive circuit.

14. A protection circuit as claimed in claim 13 wherein the power transistor includes a drain terminal and a gate terminal and the clamping circuit includes a serial connection of a first zener diode and a reverse biased diode between the drain and gate terminals of the power transistor.

15. A protection circuit as claimed in claim 14 wherein the gate drive circuit is coupled to the gate of the power transistor and drives the gate of the power transistor with a current.

16. A protection circuit as claimed in claim 14 wherein the detection circuit further includes a first resistor and a first inverter having an input terminal, wherein the first inverter is coupled to the current source and the input terminal of the first inverter is coupled both to ground through the resistor and to the first zener diode and the reverse biased diode.

17. A protection circuit as claimed in claim 14 wherein the capacitor is connected in parallel with a second zener diode.

18. A protection circuit as claimed in claim 17 wherein the detection circuit further includes a second inverter coupled to the capacitor and power transistor.

19. A protection circuit as claimed in claim 13 further including a discharge current source including a current mirror circuit, coupled to the power transistor, producing the discharge current.

20. A method for protecting a power transistor against overvoltages comprising the steps of:

in response to an overvoltage, partially turning on the power transistor and maintaining voltage across the power transistor at a predetermined voltage level lower than a forward breakdown voltage of the power transistor;

detecting a quantity of energy dissipated in the power transistor and comparing the quantity of energy dissipated with a predetermined energy threshold; and substantially fully turning on the power transistor when the quantity of energy dissipated has exceeded the predetermined energy threshold.

* * * * *

UNITED STATES PATENT AND TRADEMARK OFFICE
CERTIFICATE OF CORRECTION

PATENT NO.   : 5,465,190
DATED        : November 7, 1995
INVENTOR(S)  : Philippe Meunier and Antoine Pavlin It is certified that error appears in the above-indentified patent and that said Letters Patent is hereby corrected as shown below:

On the Title page, item [73]:

SGS-Thomson Microelectronics S.A.
    Saint-Genis, Pouilly, France

Signed and Sealed this

Thirteenth Day of February, 1996

Attest:

BRUCE LEHMAN

*Attesting Officer*      *Commissioner of Patents and Trademarks*